United States Patent
Peck et al.

(10) Patent No.: US 9,456,491 B2
(45) Date of Patent: Sep. 27, 2016

(54) HIGH CURRENT-CARRYING PRINTED CIRCUIT BOARD AND METHOD FOR PRODUCING SAID PRINTED CIRCUIT BOARD

(75) Inventors: Stefan Peck, Dillingen a.d. Donau (DE); Jan Keller, Lappersdorf (DE)

(73) Assignee: Continental Automotive GmbH, Hannover (DE)

(*) Notice: Subject to any disclaimer, the term of this patent is extended or adjusted under 35 U.S.C. 154(b) by 182 days.

(21) Appl. No.: 14/001,083

(22) PCT Filed: Feb. 20, 2012

(86) PCT No.: PCT/EP2012/052879
§ 371 (c)(1),
(2), (4) Date: Dec. 4, 2013

(87) PCT Pub. No.: WO2012/113762
PCT Pub. Date: Aug. 30, 2012

(65) Prior Publication Data
US 2014/0124248 A1    May 8, 2014

(30) Foreign Application Priority Data

Feb. 22, 2011   (DE) ........................ 10 2011 004 526

(51) Int. Cl.
*H05K 1/02*    (2006.01)

(52) U.S. Cl.
CPC .......... *H05K 1/0254* (2013.01); *H05K 1/0265* (2013.01); *H05K 1/0292* (2013.01); *H05K 1/0271* (2013.01); *H05K 2201/09272* (2013.01); *H05K 2201/1028* (2013.01); *H05K 2201/10272* (2013.01)

(58) Field of Classification Search
USPC ..... 174/72 B, 261; 361/779; 439/55, 78, 83, 439/876, 507; 228/179, 180.1, 180.2
See application file for complete search history.

(56) References Cited

U.S. PATENT DOCUMENTS

| | | | |
|---|---|---|---|
| 4,907,991 A * | 3/1990 | Kobayashi ........... | H05K 3/4685 29/843 |
| 5,446,626 A | 8/1995 | Dittmann et al. | |
| 6,015,302 A * | 1/2000 | Butts .................. | B60R 16/0238 439/76.2 |
| 6,062,903 A * | 5/2000 | Hawes .................... | H01R 12/57 174/261 |
| 6,294,739 B1 * | 9/2001 | Becker .................... | H01R 4/625 174/126.1 |
| 8,525,043 B2 * | 9/2013 | Delay .................. | H05K 1/0263 174/261 |
| 2002/0056571 A1 | 5/2002 | Canova | |
| 2009/0004888 A1 | 1/2009 | Soga et al. | |
| 2010/0025090 A1 * | 2/2010 | Delay .................. | H05K 1/0263 174/257 |

FOREIGN PATENT DOCUMENTS

| | | |
|---|---|---|
| CN | 1125505 C | 10/2003 |
| DE | 4323827 C1 | 12/1994 |

(Continued)

*Primary Examiner* — Michael F McAllister
(74) *Attorney, Agent, or Firm* — Laurence A. Greenberg; Werner H. Stemer; Ralph E. Locher

(57) ABSTRACT

A printed circuit board includes a busbar applied to a surface of the printed circuit board. The busbar is configured as a sequence of sheet metal conductor pieces which are connected to each other in an electrically conducting manner. The respective ends of the conductor pieces may have a rounded portion and a corresponding cutout, or a point and a corresponding indentation. An electrical controller, a motor vehicle and a printed circuit board configuration having at least one printed circuit board are also provided.

16 Claims, 3 Drawing Sheets

(56) References Cited

FOREIGN PATENT DOCUMENTS

| | | |
|---|---|---|
| DE | 4425803 A1 | 2/1995 |
| DE | 19713008 C1 | 6/1998 |
| DE | 60025859 T2 | 9/2006 |
| DE | 102006030133 A1 | 2/2007 |
| DE | 202008007359 U1 | 10/2008 |
| EP | 2 009 967 A2 | 12/2008 |
| JP | H1056243 A | 2/1998 |
| WO | 2009121697 A1 | 10/2009 |

* cited by examiner

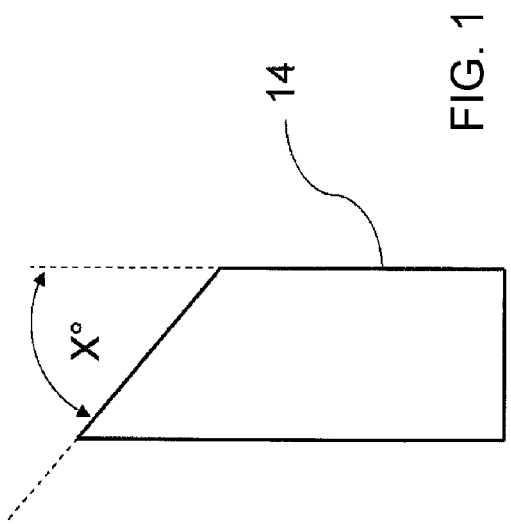

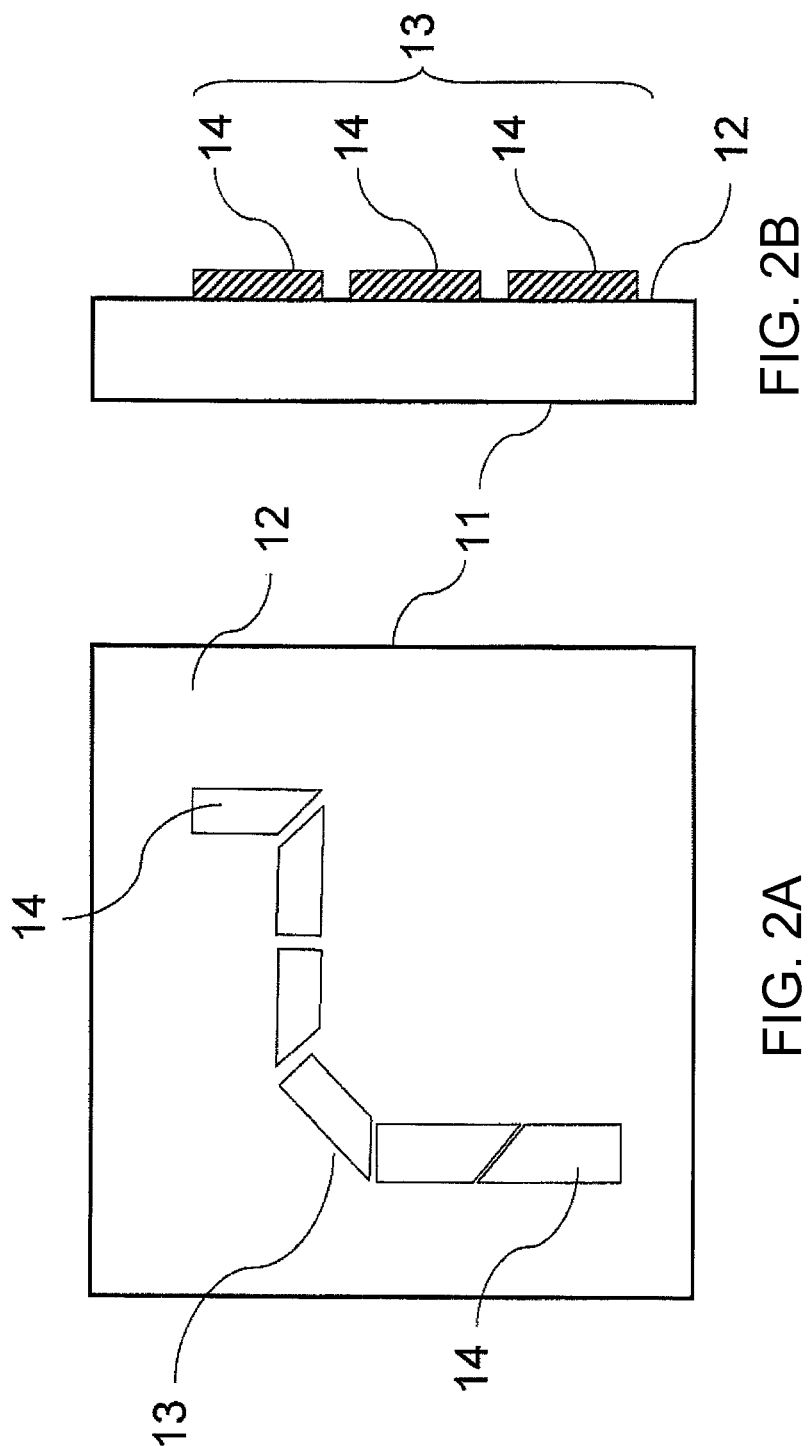

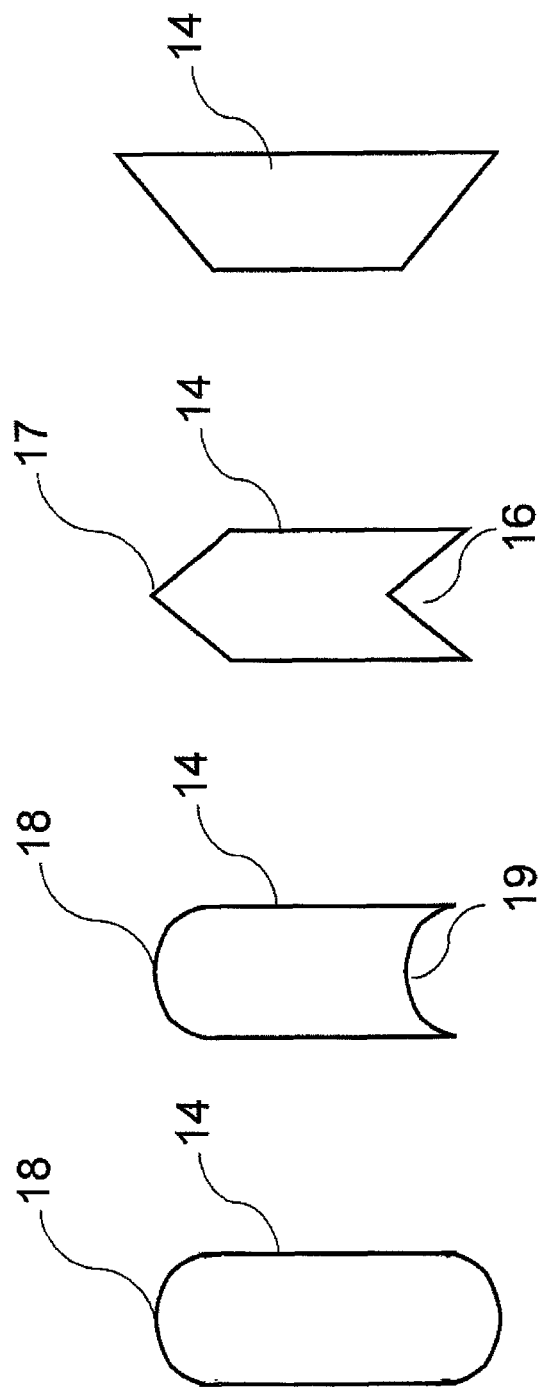

HIGH CURRENT-CARRYING PRINTED CIRCUIT BOARD AND METHOD FOR PRODUCING SAID PRINTED CIRCUIT BOARD

BACKGROUND OF THE INVENTION

Field of the Invention

The invention relates to a printed circuit board having a high current-carrying capacity and to a method for producing such a printed circuit board, in particular for electrical control units.

In modern electrical control units, in particular for the automotive industry, it is the case with increasing prevalence that high currents are conducted via the printed circuit board. The conductor tracks provided for this purpose are usually designed with appropriate width and over a plurality of layers or levels of the printed circuit board in order to counteract overheating and thus a high voltage drop in the lines.

What is disadvantageous about a printed circuit board populated in this way with wide conductor tracks, which are designated hereinafter as busbars or current bridges, is that a large proportion of the area of the printed circuit board cannot be utilized for other devices and this type of printed circuit boards thus becomes very cost-intensive. In some cases it is even impossible to pass the required high current via the printed circuit board.

The busbars have hitherto been applied or laminated onto or into the printed circuit board by means of SMD (Surface Mounted Device) or THT (Through-the-hole Technology) soldering methods. These busbars have to be designed specifically for one printed circuit board product having a defined geometry and re-use for other printed circuit board products is therefore virtually ruled out. Consequently, new current bridge layouts always have to be developed for new printed circuit board products. As a result, the production costs increase greatly in the case of layout changes, which is also based on the fact that manufacturing with the population of the printed circuit board has to be adapted anew in the event of such a design change.

BRIEF SUMMARY OF THE INVENTION

Therefore, the problem addressed by the invention is that of providing a printed circuit board having a high current-carrying capacity which has busbars which can be flexibly adapted to layout changes of the printed circuit board. The busbar arrangement of the printed circuit board is furthermore intended to be less susceptible to temperature fluctuations and to exhibit lower failure rates in the event of vibrations and deformations of the printed circuit board. Moreover, the problem addressed by the invention is that of specifying a method for producing an improved printed circuit board having a high current-carrying capacity which can be integrated into the primarily automated production method for printed circuit boards and can also be easily adapted in the event of layout changes.

The problem is solved according to the invention by means of the features of the independent claims. Advantageous configurations of the invention are specified in the dependent claims.

The printed circuit board according to the invention comprises a busbar applied on the surface of the printed circuit board, wherein the busbar is formed by a sequence of sheet metal conductor pieces which are electrically conductively connected to one another.

The term sheet metal conductor pieces in the context of the present invention is understood to mean substantially longitudinally and areally extended, metallic, electrically conductive material sections in the form of easily producible, in particular stampable and embossable conductors produced from customary conductor materials such as, for example, copper, silver and gold.

The embodiment of the busbar as a sequence of sheet metal conductor pieces makes it possible that high currents can be conducted via the printed circuit board in an area-saving manner. Moreover, as a result of this multipartite embodiment according the invention of the busbar in a sequence of sheet metal conductor pieces, the layout of the printed circuit board can be configured in a manner flexibly adapted to the spatial conditions of the other electrical components, as a result of which cost savings are made possible on account of the current paths that can be fashioned more easily. Furthermore, the printed circuit boards configured according to the invention in this way are less susceptible to temperature fluctuations and exhibit lower failure rates in the event of vibrations and deformations of the printed circuit board.

According to the invention, the sheet metal conductor pieces are electrically conductively connected to one another. By way of example, the sheet metal conductor pieces can be connected to one another by soldered joints or by electrically conductive adhesive. The sheet metal conductor pieces are preferably connected by soldered joints. This can be effected in an automatable method in a manner integrated into the method for producing the printed circuit board, in a cost-saving manner. The soldered joints or adhesive bonding locations between the sheet metal conductor pieces of the busbar can function in the manner of an expansion joint, for example, and thus advantageously contribute to the fact that the printed circuit board overall is less susceptible to temperature fluctuations and the printed circuit board exhibits lower failure rates even in the event of vibrations and deformations.

In one preferred configuration of the invention, the sheet metal conductor pieces have an identical geometry. By virtue of the fact that the sheet metal conductor pieces have an identical geometry, they can be manufactured in mass production. This considerably reduces the production costs of the current bridges of a printed circuit board according to the invention in comparison with the previous individual fabrication for a specific printed circuit board layout. Furthermore, the sequence of the sheet metal conductor pieces having an identical geometry can be changed very easily and in a computer-calculated manner in the event of a layout change, such that only a recurring geometry has to be stored in the corresponding software.

It is preferably provided that the sheet metal conductor pieces have an angular portion at least at one end. This makes it possible to arrange the current bridges as sequences of the sheet metal conductor pieces including with a plurality of changes in direction, for example by 90°, in a small space. As a result, it is advantageously possible, with regard to further layout requirements of other devices, to embody the busbars in a manner saving as much area as possible and additionally to shorten further signal and current paths or to fashion them more easily. This can contribute to reducing the failure rates of the printed circuit boards.

Furthermore, one preferred configuration of the invention provides for sheet metal conductor pieces to have a rounded portion at least at one end.

In the context of a further preferred configuration of the invention it is provided that the sheet metal conductor pieces have a rounded portion at least at one end, and at the other end a cutout corresponding to the rounded portion. According to the invention this means that a sheet metal conductor piece can be attached, by the end at which the mounted portion is arranged, to the end having the cutout of a second sheet metal conductor piece. In other words, sheet metal conductor pieces can be arranged like an articulated joint with respect to one another. The cutout and rounded portion of the two sheet metal conductor pieces can preferably be embodied in a manner coordinated with one another in such a way that it would be possible to place them against one another seamlessly or with an equidistantly configured joint. By means of this seam or joint, the two sheet metal conductor pieces can then be electrically conductively connected to one another for example by means of soldering or adhesive bonding. Both the rounded portion and the cutout can be embodied in a semicircular fashion, for example. This embodiment of the sheet metal conductor pieces has the advantage that a particularly good current-carrying capacity can be achieved. Furthermore, the arrangement of the sheet metal conductor pieces to form the busbar can additionally be realized with a large angle bandwidth. This furthermore increases the degree of freedom in the layout design of the printed circuit board according to the invention.

In another preferred configuration, the sheet metal conductor pieces can have an indentation at least at one end, and at the other end a point corresponding to the indentation. According to the invention, this means that a sheet metal conductor piece can be attached, by the end at which the point is arranged, to the end having the indentation of a second sheet metal conductor piece. The indentation and the point of the two sheet metal conductor pieces can preferably be embodied in a manner coordinated with one another in such a way that it would be possible to place them against one another seamlessly or with an equidistantly configured joint. By means of this seam or joint, the two sheet metal conductor pieces can then be electrically conductively connected to one another for example by means of soldering or adhesive bonding. The printed circuit board having a busbar embodied in such a way can exhibit lower failure rates in the event of vibrations and deformations and overall can be less susceptible to temperature fluctuations. The printed circuit boards having busbars configured according to the invention in this way can furthermore have a good current-carrying capacity.

The invention furthermore relates to a method for producing a printed circuit board according to the invention. The method according to the invention provides for the printed circuit board to be populated with the sheet metal conductor pieces in an automated manner in an SMD method.

The abbreviation SMD stands for Surface Mounted Devices and signifies surface-mountable devices. Such devices have no wire connections, but rather are secured by means of connection areas directly on a printed circuit board, for example by being fixedly adhesively bonded and then soldered. Advantageously, therefore, this SMD method does not require complex holes on the printed circuit board or wiring that would be unavoidable in the case of through-the-hole technology (THT) or pin-in-hole technology (PIH).

Population with the sheet metal conductor pieces can be effected in an automated manner and with high precision. Moreover, as a result of avoiding connection wires and associated holes, it is possible to use a significantly thinner printed circuit board material, thus advantageously resulting in a weight reduction. A printed circuit board according to the invention can therefore be manufactured significantly more cost-effectively. Furthermore, the automated population of the printed circuit board with the sheet metal conductor pieces by an SMD method makes it possible to achieve not only faster and more expedient production but also a particularly good manufacturing quality. The manufacturing quality can additionally be increased by possible automatic optical inspection (AOI). Overall, it is thus possible, without any problems, to integrate the population of the printed circuit board with the busbar composed of sheet metal conductor pieces and the population of the printed circuit board with further devices of a desired layout in a process and, if appropriate, to carry them out in one method step.

SMD technology is furthermore advantageous since it enables a small device spacing and optimum miniaturization and the signal and current paths can thus be shortened. This enables, if appropriate, the improvement of radio-frequency properties and smaller ohmic losses and reduces the susceptibility to faults and the failure rate of the printed circuit board. Furthermore, in the SMD method, printed circuit boards can be populated with devices on both sides.

In a further configuration of the method according to the invention, the sheet metal conductor pieces can be mechanically and electrically conductively connected to one another and/or to conductor tracks of the printed circuit board by means of a reflow soldering step and/or by means of an adhesive bonding step using an electrically conductive adhesive. The sheet metal conductor pieces are preferably connected by means of soldering. Reflow soldering affords the advantage that, by means of a relatively simple populating method, for example simple Pick & Place, devices can be positioned on the printed circuit board and can subsequently be soldered jointly in a furnace in a batch process. In addition, a self-alignment effect can be used during reflow. Advantageously, therefore, for example small positioning errors during SMD device placement can be automatically corrected during reflow soldering by means of the surface tension of the liquid solder.

The invention furthermore relates to the use of a printed circuit board according to the invention, such as has been described above in various configurations, in an electrical controller, in heavy-current electronics, in particular in on-board power supply system controllers, fuse boxes, HEV (hybrid electric vehicles), and in non-automotive high-current applications. In other words, the invention also encompasses an electrical controller, heavy-current electronics or high-current application containing one or more printed circuit boards according to the invention. Owing to the use of the printed circuit boards according to the invention, the components, units and devices manufactured therewith are also less susceptible to temperature fluctuations and also exhibit lower failure rates in the event of vibrations, for example engine vibrations, and deformations of the printed circuit board.

In one preferred embodiment, the electrical controller can be a transmission or engine controller of a motor vehicle. In other words, the invention also encompasses an electrical transmission or engine controller containing one or more printed circuit boards according to the invention. With regard to the advantages, reference is hereby subsequently made explicitly to the explanations concerning the printed circuit board according to the invention in its possible configurations and to the method according to the invention.

The invention furthermore relates to a motor vehicle, comprising at least one electrical controller according to the invention or at least one printed circuit board according to the invention. With regard to the advantages, reference is hereby subsequently made explicitly to the explanations concerning the printed circuit board according to the invention in its possible configurations and to the method according to the invention.

The invention is explained by way of example below with reference to the accompanying drawings on the basis of preferred exemplary embodiments, without being restricted thereto.

BRIEF DESCRIPTION OF THE SEVERAL VIEWS OF THE DRAWING

FIG. 1: shows a schematic plan view of a sheet metal conductor piece for a printed circuit board according to the invention;

FIGS. 2a-2b: show a schematic plan view and a schematic side view of a printed circuit board according to the invention; and FIGS. 3a-3d show a schematic plan view of sheet metal conductor pieces having four different geometries for a printed circuit board according to the invention.

DESCRIPTION OF THE INVENTION

FIG. 1 illustrates a schematic plan view of a sheet metal conductor piece 14 for a printed circuit board 11 according to the invention. The sheet metal conductor piece 14 has an angular portion with an angle X°. This angle X° can be 45°, for example, but is not restricted thereto. Advantageously, by virtue of the angular portion of the sheet metal conductor piece 14, in the production of a busbar 13 made from a plurality of such sheet metal conductor pieces 14, it is possible to achieve desired direction changes required for example as a result of a predefined layout of circuits and/or of the arrangement of the further devices on the printed circuit board 11. As a result, it is therefore advantageously possible, with regard to further layout requirements of other devices, to embody the busbars 13 in a manner saving as much area as possible and additionally to shorten signal and current paths or to fashion them more easily. This can contribute to reducing the failure rates of the printed circuit boards 11.

FIG. 2a shows a schematic plan view of a printed circuit board 11 according to the invention with a busbar 13. The busbar 13 is composed of a plurality of sheet metal conductor pieces 14 having an angular portion, as illustrated in FIG. 1. In this embodiment, the sheet metal conductor pieces 14 used have an identical geometry. The sheet metal conductor pieces 14 can advantageously be produced in mass production. This considerably reduces the production costs of the busbars 13 of a printed circuit board 11 according to the invention in comparison with the previous individual fabrication for a specific printed circuit board layout. Furthermore, the sequence of the sheet metal conductor pieces 14 having an identical geometry can be changed very easily and in a computer-calculated manner in the event of a layout change, such that only a recurring geometry has to be stored in the corresponding software.

FIG. 2b shows a schematic side view of a printed circuit board 11 according to the invention with a busbar 13, which is arranged on the surface 12 of the printed circuit board 11. The busbar 13 is formed as a sequence of a plurality of sheet metal conductor pieces 14, wherein only three sheet metal conductor pieces 14 are shown by way of example and in order to simplify the illustration. The soldering and/or adhesive-bonding connection of the sheet metal conductor pieces 14 for mechanical and electrical connection is not illustrated. The soldered joints or adhesive bonding locations between the sheet metal conductor pieces 14 of the busbar 13 can function in the manner of an expansion joint, for example, and thus advantageously contribute to the fact that the printed circuit board 11 overall is less susceptible to temperature fluctuations and the printed circuit board exhibits lower failure rates even in the event of vibrations and deformations.

FIGS. 3a to 3d show sheet metal conductor pieces 14 in a schematic plan view with four different geometries.

FIG. 3a shows a sheet metal conductor piece 14 having two rounded portions at opposite ends.

FIG. 3b shows a sheet metal conductor piece 14 having a rounded portion 18 at one end, and at the other end a cutout 19 corresponding to the rounded portion 18. This means that a sheet metal conductor piece 14 can be attached, by the end at which the rounded portion 18 is arranged, to an end having the cutout 19 of a second sheet metal conductor piece 14 configured in such a way. Such sheet metal conductor pieces 14 can be arranged for example like an articulated joint with respect to one another. In this configuration, both the rounded portion 18 and the cutout 19 are embodied in a semicircular fashion. This embodiment of the sheet metal conductor pieces 14 has the advantage that a particularly good current-carrying capacity can be achieved. Furthermore, an arrangement of the sheet metal conductor pieces 14 to form a busbar 13 can additionally be realized as a sequence with a large angle bandwidth. This furthermore increases the degree of freedom in the layout design of a printed circuit board 11 according to the invention.

FIG. 3c shows a sheet metal conductor piece 14 having an indentation 16 at one end, and at the other end a point 17 corresponding to the indentation 16. According to the invention, this means that a sheet metal conductor piece 14 can be attached, by the end at which the point 17 is arranged, to the end having the indentation 16 of an identically configured second sheet metal conductor piece 14. The two sheet metal conductor pieces 14 can then be electrically conductively connected to one another for example by means of soldering or adhesive bonding. The printed circuit board 11 having a busbar 13 embodied in such a way can exhibit lower failure rates in the event of vibrations and deformations and overall can be less susceptible to temperature fluctuations. The printed circuit boards 11 having busbars 13 configured according to the invention in this way can furthermore have a good current-carrying capacity.

FIG. 3c shows a sheet metal conductor piece 14 having an angular portion at two mutually opposite ends, thus resulting in a trapezoidal shape in the configuration shown. Advantageously, as a result of the angular portions of the sheet metal conductor piece 14 and the trapezoidal shape thereof, desired direction changes can be achieved in the production of a busbar 13 made from a plurality of such sheet metal conductor pieces 14. As a result, it is advantageously possible, with regard to further layout requirements of other devices, to embody the busbars 13 in a manner saving as much area as possible and additionally to shorten further signal and current paths or to fashion them more easily. This can contribute to reducing the failure rates of the printed circuit boards 11.

To summarize, the invention provides a printed circuit board having a high current-carrying capacity which has at least one busbar formed from a sequence of sheet metal conductor pieces, wherein the sheet metal conductor pieces are electrically conductively connected to one another and can be flexibly adapted to layout changes of the printed circuit board. The printed circuit board having the busbar arrangement according to the invention is furthermore less susceptible to temperature fluctuations and exhibits a lower failure rate in the event of vibrations and deformations. In addition, a method for producing such an improved printed circuit board having a high carrying capacity is provided, which method can be integrated into the primarily automated production method for printed circuit boards and can also be easily adapted in the event of layout changes.

The invention claimed is:

1. A printed circuit board, comprising:
   a surface of the printed circuit board;
   at least one busbar applied on said surface of the printed circuit board;
   said busbar formed by a sequence of multiple, identical electrically conductively interconnected sheet metal conductor pieces having opposite ends, at least one end of each of said identical pieces having at least one of: an obliquely angled portion or a rounded portion; and
   all of said multiple, identical electrically conductively interconnected sheet metal conductor pieces being mounted directly to said surface of the printed circuit board in a single plane.

2. The printed circuit board according to claim 1, wherein said at least one end includes at least one angular portion.

3. The printed circuit board according to claim 1, wherein said at least one end includes a rounded portion.

4. The printed circuit board according to claim 1, wherein said sheet metal conductor pieces have a rounded portion at one of said ends, and a cutout corresponding to said rounded portion at the other of said ends.

5. The printed circuit board according to claim 1, wherein said sheet metal conductor pieces have an indentation at one of said ends, and a point corresponding to said indentation at the other of said ends.

6. The printed circuit board according to claim 1, wherein said surface of the printed circuit board is populated with said sheet metal conductor pieces for surface-mountable devices.

7. The printed circuit board according to claim 1, wherein said sheet metal conductor pieces are mechanically and electrically conductively connected to at least one of other sheet metal conductor pieces or conductor tracks of the printed circuit board by at least one of reflow solder or an adhesive bond using an electrically conductive adhesive.

8. The printed circuit board according to claim 1, wherein said busbar is configured to be used in an electrical controller, a heavy-current electronic unit, an on-board power supply system controller, a fuse box, a hybrid electric vehicle or a non-automotive high-current application.

9. An electrical controller, comprising at least one printed circuit board according to claim 1.

10. The electrical controller according to claim 9, wherein the electrical controller is a transmission or engine controller of a motor vehicle.

11. A motor vehicle, comprising at least one printed circuit board according to claim 1.

12. A printed circuit board configuration, comprising:
    a printed circuit board having a surface;
    at least one busbar applied on said surface of said printed circuit board;
    said at least one busbar formed by a sequence of multiple, identical electrically conductively interconnected sheet metal conductor pieces having opposite ends;
    each identical piece having one of said opposite ends having a rounded portion and the other of said opposite ends having a rounded portion or a cutout corresponding to said rounded portion; and
    all of said multiple, identical electrically conductively interconnected sheet metal conductor pieces being mounted directly to said surface of the printed circuit board in a single plane.

13. The printed circuit board configuration according to claim 12, wherein said rounded portion and said cutout each have a semicircular shape.

14. The printed circuit board configuration according to claim 12, wherein said cutout and said rounded portion are coordinated with one another to permit said sheet metal conductor pieces to be combined seamlessly or with an equidistantly configured joint.

15. A printed circuit board configuration, comprising:
    a printed circuit board having a surface;
    at least one busbar applied on said surface of said printed circuit board;
    said at least one busbar formed by a sequence of multiple, identical electrically conductively interconnected sheet metal conductor pieces having opposite ends;
    each identical piece having one of said opposite ends having a point and the other of said opposite ends having a point or an indentation corresponding to said point; and
    all of said multiple, identical electrically conductively interconnected sheet metal conductor pieces being mounted directly to said surface of the printed circuit board in a single plane.

16. The printed circuit board configuration according to claim 15, wherein said indentation and said point are coordinated with one another to permit said sheet metal conductor pieces to be combined seamlessly or with an equidistantly configured joint.

* * * * *